(12) United States Patent
Miyao et al.

(10) Patent No.: US 7,999,269 B2
(45) Date of Patent: Aug. 16, 2011

(54) LIGHT EMITTING APPARATUS AND ELECTRONIC DEVICE

(75) Inventors: Toshiaki Miyao, Chino (JP); Hiroaki Jo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/475,949

(22) Filed: Jun. 1, 2009

(65) Prior Publication Data

US 2009/0321751 A1 Dec. 31, 2009

(30) Foreign Application Priority Data

Jun. 25, 2008 (JP) ................................ 2008-165525

(51) Int. Cl.
*H01L 27/15* (2006.01)
(52) U.S. Cl. ............... 257/84; 257/83; 257/82; 257/88; 257/98; 257/E33.076

(58) Field of Classification Search ............... 257/84, 257/83, 82, 88, 98, E33.076
See application file for complete search history.

(56) References Cited

U.S. PATENT DOCUMENTS
6,452,341 B1 * 9/2002 Yamauchi et al. ......... 315/169.1

FOREIGN PATENT DOCUMENTS
JP   A-2007-290329   11/2007

* cited by examiner

*Primary Examiner* — Bradley K Smith
*Assistant Examiner* — Mohammad T Karimy
(74) *Attorney, Agent, or Firm* — Oliff & Berridge PLC

(57) ABSTRACT

A light emitting apparatus includes a light emitting element formed on a surface of a substrate and a light receiving element formed on an area other than an area overlapping the light emitting element on the surface of the substrate, the light receiving element detecting light emitted from the light emitting element.

14 Claims, 8 Drawing Sheets

LIGHT EMITTING APPARATUS AND ELECTRONIC DEVICE

BACKGROUND

1. Technical Field

The present invention relates to a structure of a light emitting apparatus that uses a light emitting element such as an organic EL (Electroluminescence) element.

2. Related Art

A technique for correcting an amount of electric energy (for example, electric current) provided to a light emitting element in accordance with a light amount of light emitted from the light emitting element has been proposed. For example, in JP-A-2007-290329, a technique in which light emitted from a light emitting element is received by a light receiving element formed so as to overlap the light emitting element, and an electric current amount of a drive current provided to the light emitting element is corrected in accordance with a light amount received by the light receiving element is disclosed.

However, in a structure in which the light receiving element is formed immediately below the light emitting element like in Patent Document 1, reflection and absorption are generated when the light emitted from the light emitting element goes through the light receiving element, and the amount of light emitted to the outside is reduced. In short, there is a problem that a use efficiency of the light emitted from the light emitting element is decreased. If the light amount (the electric current amount of the drive current) of the light emitting element is increased in order to compensate for the light reduction due to the light receiving element, a deterioration of the light emitting element is accelerated, thereby shortening the life of the element.

SUMMARY

An advantage of some aspects of the invention is that it solves the problem of suppressing a decrease of use efficiency of the emitted light due to the light receiving element that detects the light from the light emitting element. A light emitting apparatus of a first aspect of the invention includes: a light emitting element formed on a surface of a substrate; and a light receiving element formed on an area other than an area overlapping the light emitting element on the surface of the substrate, the light receiving element detecting light emitted from the light emitting element. In the above configuration, since the light receiving element is formed not to overlap the light emitting element when seen from the direction vertical to the substrate, it is possible to increase the use efficiency of the light emitted from the light emitting element, compared with a configuration of Patent Document 1 in which the light emitting element and the light receiving element overlap each other. The invention is especially preferable for a bottom emission type light emitting apparatus from which a part of emitted light from the light emitting element goes through an insulation layer (for example, insulation layer L1 and insulation layer L2 in FIG. 4) that covers the light receiving layer and emits In a preferred aspect of the invention, the light receiving element includes a light receiving layer having a first region and a second region which have a different conductivity type from each other, and the first region is located between the second region and the light emitting element. For example, the light receiving element is a PN type or PIN type diode in which the first region is formed by one of an N type semiconductor and a P type semiconductor and the second region is formed by the other one of the N type semiconductor and the P type semiconductor.

The light emitting apparatus of a specific example of the above configuration includes a first detection electrode conducting electricity to the first region and a second detection electrode conducting electricity to the second region, wherein an area overlapping the first detection electrode in the first region is smaller than an area overlapping the second detection electrode in the second region. According to the above configuration, since an area covered by the first detection electrode in the first region that is on the light emitting element side of the second region is small, there is an advantage that a large amount of light entering the first region can be secured.

In a more preferred aspect, a sheet resistance of the first region is lower than a sheet resistance of the second region. In the above aspect, there is an advantage that a resistance of a path from the first region to the first detection electrode is suppressed, despite a configuration in which the area overlapping the first detection electrode in the first region is reduced in order to secure an amount of light entering the first region. On the other hand, in the second region, since the area overlapping the second detection electrode is sufficiently secured although the sheet resistance of the second region is higher than the sheet resistance of the first region, a resistance of a path from the second region to the second detection electrode is suppressed. As a result, it is possible both to secure the amount of light entering the light receiving element and to lower the resistance of the path for inputting/outputting signals from/to the light receiving element.

In a first aspect of the invention, a light receiving layer is a single film body in which the first region and the second region extend in a second direction crossing the first direction going from the light emitting element to the light receiving element. In the above aspect, since the first region and the second region continuously extend in the second direction, there is an advantage that a large amount of light entering the light receiving layer can be secured, compared with, for example, a configuration in which the light receiving layer is divided into multiple sections. A specific example of the first aspect will be described later as a first embodiment.

The light emitting apparatus of the first aspect includes, for example, the first detection electrode in which a portion (for example, portion p1 of FIG. 3) overlapping a part of the first region conducts electricity to the first region, and a second detection electrode in which a portion (for example, portion p2 of FIG. 3) overlapping the second region and extending in the second direction conducts electricity to the second region. In the above aspect, since the first detection electrode overlaps a part of the first region and the second detection electrode extends in the second direction and overlaps the second region, a resistance of a path from the second region to the second detection electrode can be reduced while securing the amount of the light entering the first region.

In a second aspect of the invention, the light receiving layer includes multiple unit sections arranged with a gap therebetween in a second direction crossing a first direction (for examples Y direction in figures) going from the light emitting element to the light receiving element, each of the multiple unit sections having the first region and the second region, the first region of each of the unit sections conducts electricity to each other, and the second region of each of the unit sections conducts electricity to each other. In the above aspect, since the light receiving layer is divided into multiple unit sections, there is an advantage that a possibility of the light receiving layer being destroyed due to static electricity during a manufacturing process of the light emitting apparatus is reduced, compared with a configuration in which the light receiving layer is a single film body. A specific example of the second aspect will be described later as a second embodiment.

The light emitting apparatus of the second aspect includes, for example: multiple conducting electrodes (for example, conducting electrodes 54 in FIG. 5) formed separately from each other at every gap to bridge the gap between each of the unit sections next to each other, a part of the multiple conducting electrodes which overlaps a part of the first region conducting electricity to the first region and a second detection electrode, a part of which (for example, portion p2 in FIG. 5) extends in the second direction to penetrate through each of the second regions of the multiple unit sections, the part conducting electricity to each of the second regions. In the above aspect, since the multiple conducting electrodes that electrically connect the first regions of each unit section are formed separately from each other, and the second detection electrode extends in the second direction and overlaps the second regions of each unit section, a resistance of a path from the second region to the second detection electrode can be reduced while securing the amount of the light entering the first region.

In a third aspect of the invention, the light receiving layer includes the first region continuously extending along a second direction crossing a first direction going from the light emitting element to the light receiving element, and multiple the second regions arranged with a gap therebetween in the second direction, wherein the second region of each of the unit sections conducts electricity to each other. In the above aspect, since the first region continuously extends in the second direction, there is an advantage that a large amount of light entering the light receiving layer (the first region) can be secured, compared with, for example, a configuration in which the first region is divided into multiple sections. In the third aspect, since the second region is divided into multiple sections, there is an advantage that a possibility of the light receiving layer being destroyed due to static electricity during a manufacturing process of the light emitting apparatus is reduced, compared with a configuration in which the second region is continuously formed. A specific example of the third aspect will be described later as a third embodiment.

The light emitting apparatus of the third aspect includes, for example, the first detection electrode in which a portion (for example, portion p1 of FIG. 6) overlapping a part of the first region conducts electricity to the first region, and a second detection electrode in which a portion (for example, portion p2 of FIG. 6) extending in the second direction to penetrate through each of the second regions of the multiple unit sections conducts electricity to each of the second regions. In the above aspect, since the first detection electrode overlaps a part of the first region and the second detection electrode extends in the second direction and overlaps each of the second regions, a resistance of a path from each of the second regions to the second detection electrode can be reduced while securing the amount of the light entering the first region.

The light emitting apparatus according to a preferred aspect of the invention includes a transistor formed on the surface of the substrate and used to drive the light emitting element, wherein the light emitting element is formed by the same layer as a semiconductor layer of the transistor. In the above aspect, since the light receiving element and the semiconductor layer of the transistor are formed from the same layer, there is an advantage that a manufacturing process of the light emitting apparatus is simplified, compared with a case in which the light receiving element and the semiconductor layer of the transistor are formed separately.

The light emitting apparatus according to a preferred aspect of the invention includes a reflective layer (for example, reflective layer 562 or reflective layer 564 in FIGS. 7, 10, 11) formed on an opposite side of the light receiving element with the light emitting element therebetween on the surface of the substrate. In the above aspect, it is possible to reflect light that is emitted from the light emitting element and goes to the opposite side of the light receiving element by the reflective layer to the light receiving element side. Therefore, there is an advantage that a large amount of light entering the light receiving element can be secured.

The light emitting apparatus of the aspect of the invention is used in various electronic devices. A typical example of an electronic device related to the invention is an electrophotographic image forming apparatus which uses the light emitting apparatus of the above aspects to expose an image carrier such as a photosensitive drum. The image forming apparatus includes the image carrier (for example, photosensitive drum) on which a latent image is formed by exposure, the light emitting apparatus of the aspect of the invention for exposing the image carrier, and a developing unit for forming an actual image by supplying developer (for example, toner) to the latent image on the image carrier.

However, the usage of the light emitting apparatus of the aspect of the invention is not limited to exposing the image carrier. For example, in an image reading apparatus such as a scanner, the light emitting apparatus of the invention can be used to illuminate an original document. The image reading apparatus includes the light emitting apparatus of the above aspects, and a light receiving apparatus (for example, an light receiving element such as a CCD (Charge Coupled Device) element) for converting light that is emitted from the light emitting apparatus and reflected by a reading object (original document) into an electric signal. Furthermore, a light emitting apparatus in which light emitting elements are arranged in matrix form is also used as a display apparatus of various electronic devices such as a personal computer and a mobile phone.

BRIEF DESCRIPTION OF THE DRAWINGS

The invention will be described with reference to the accompanying drawings, wherein like numbers reference like elements.

DESCRIPTION OF EXEMPLARY EMBODIMENTS

A: First Embodiment

Figure 1:
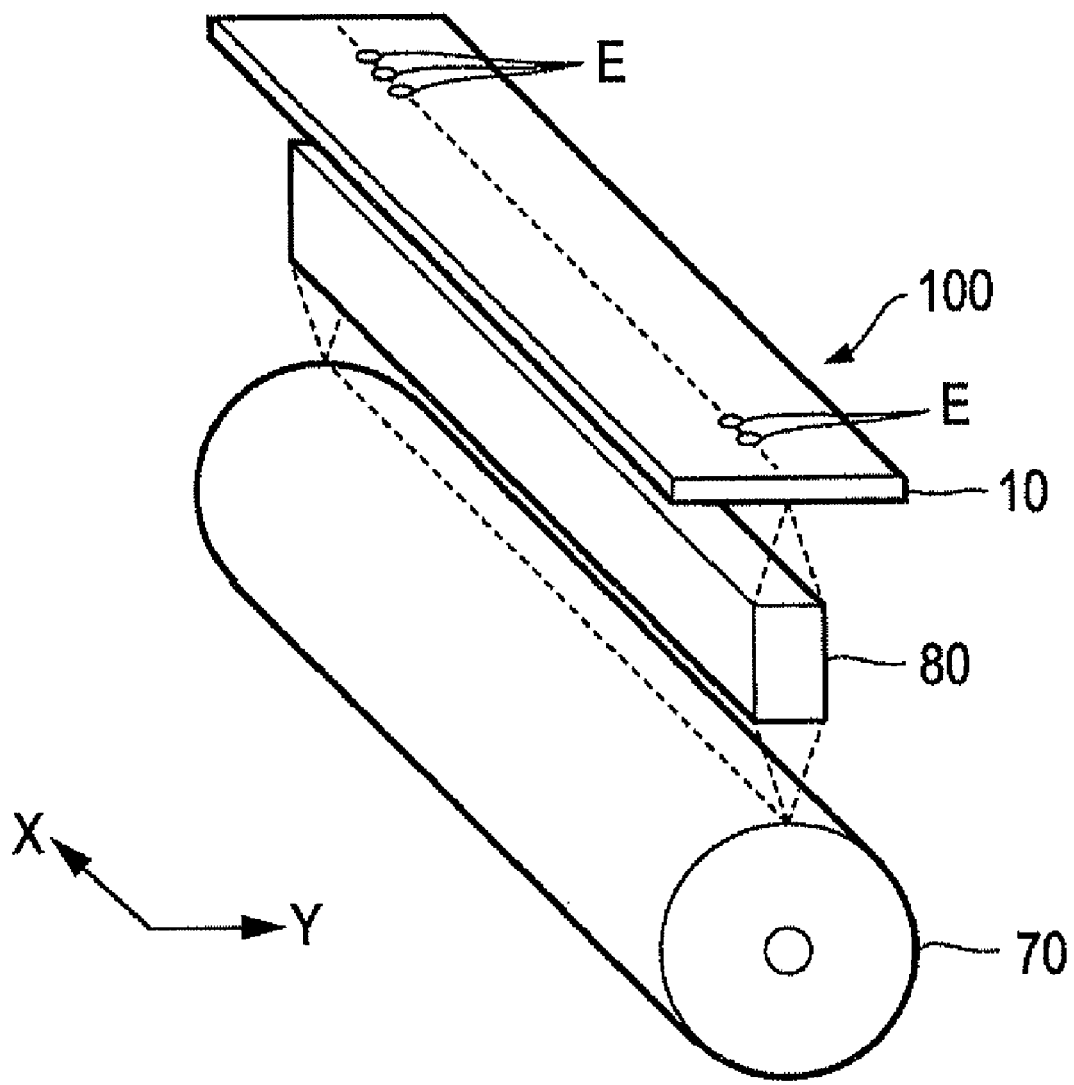
FIG. 1 is a perspective view showing a partial configuration of an image forming apparatus.

FIG. 1 is a perspective view showing a partial structure of an electrophotographic image forming apparatus which uses a light emitting apparatus according to a first embodiment of the invention as an exposing apparatus (light head). As shown in FIG. 1, the image forming apparatus includes a light emitting apparatus 100, a photosensitive drum 707 and a focusing lens array 80. The light emitting apparatus 100 includes a long substrate 10 in which a number of light emitting elements E are formed along the X direction (main scanning direction). The photosensitive drum 70 is a cylindrical body supported by a rotation axis extending in the X direction, and rotates with an outer surface thereof facing the substrate 10. The focusing lens array 80 arranged in a gap between the light emitting apparatus 100 and the photosensitive drum 70 focuses light emitted from each light emitting element E onto the outer surface of the photosensitive drum 70 to form an image. By the above exposure, a latent image (electrostatic latent image) corresponding to a desired image is formed on the outer surface of the photosensitive drum 70.

Figure 2:
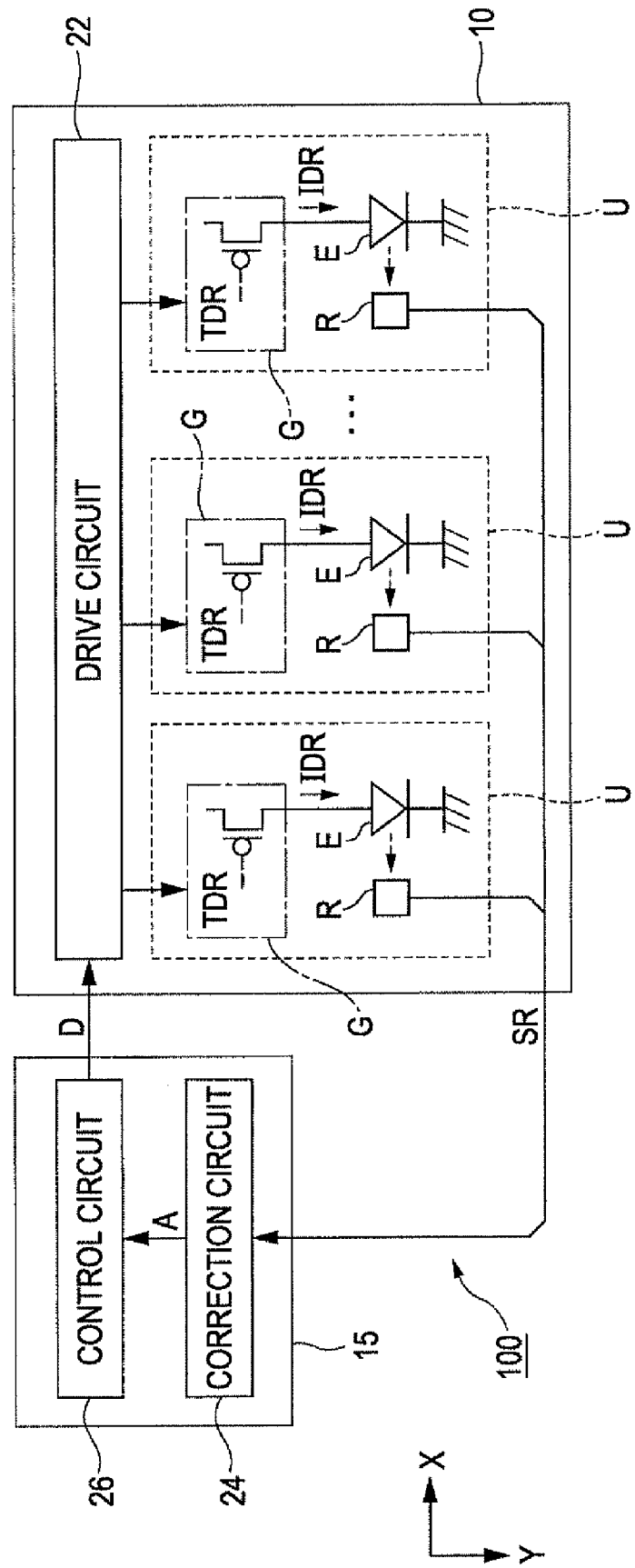
FIG. 2 is a block diagram of a light emitting apparatus of a first embodiment of the invention.

FIG. 2 is a block diagram showing an electric configuration of the light emitting apparatus 100. As shown in FIG. 2, a drive circuit 22 and multiple unit circuits U are arranged on the surface of the substrate 10 (on the surface opposite the side of the substrate facing the photosensitive drum 70). The multiple unit circuits U are arranged in the X direction. Each unit circuit U includes the light emitting element E, a pixel circuit G, and a light receiving element R. The light emitting element E is an organic EL element in which a light emitting layer of an organic EL material is placed between an anode and a cathode facing each other. An arrangement form of the multiple light emitting elements E is arbitrary. For example, an arrangement in which multiple light emitting elements E are arranged in a twoline zigzag pattern may be employed.

The pixel circuit G is a circuit for driving the light emitting element E, and is constituted by including multiple transistors formed on the surface of the substrate 10. For example, the pixel circuit G in FIG. 2 includes a drive transistor TDR. The drive transistor TDR controls an electric current amount of a drive current IDR in accordance with a gate voltage of the drive transistor TDR. The light emitting element E emits light with a light amount (brightness) corresponding to the electric current amount of the drive current IDR provided from the drive transistor TDR. The light receiving element R in each unit circuit U receives light emitted from the light emitting element E in the same unit circuit U, and outputs a detection signal SR corresponding to a received light amount.

Image data D that specifies a gray level of each pixel of an image which the image forming apparatus is to form is provided to the drive circuit 22. The drive circuit 22 controls each pixel circuit G so that each light emitting element E emits light with a light amount in accordance with the image data D. More specifically, the drive circuit 22 sets the gate voltage of the drive transistor TDR of each pixel circuit G in accordance with the image data D.

A circuit substrate 15 is connected to the substrate 10. A correction circuit 24 and a control circuit 26 are mounted on the circuit substrate 15. The correction circuit 24 and the control circuit 26 correct the light amount of each light emitting element E on the basis of the detection signal SR provided from each light receiving element R. More specifically, the correction circuit 24 determines a correction value A for each light emitting element E on the basis of the detection signal SR provided from the corresponding light receiving element R. The control circuit 26 corrects the image data D that specifies the light amount of each light emitting element E on the basis of the correction value A of the light emitting element E. The gate voltage of the drive transistor TDR in each unit circuit U is controlled in accordance with the corrected image data D, so that the light emitted from each light emitting element E is corrected to a light amount corresponding to the light amount received by the light receiving element R. The correction values A of the light emitting elements E are set so that the light amounts of the light emitting elements E corresponding to the respective pixels to which the image data D sets the same grey level are equalized.

Figure 3:
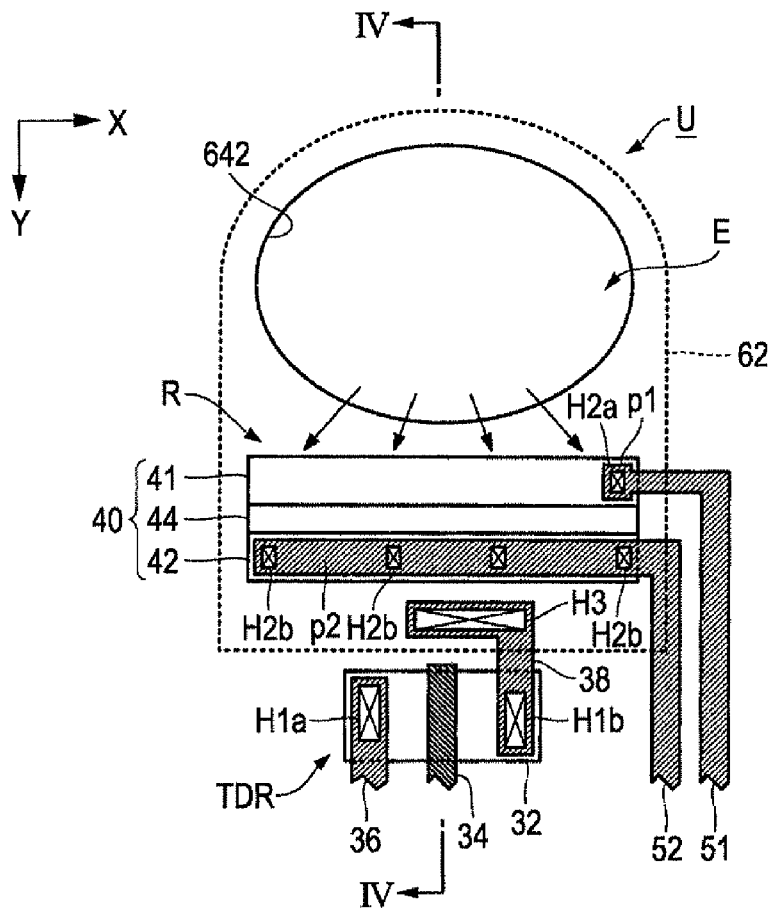
FIG. 3 is a plan view of a single unit circuit of the light emitting apparatus.
Figure 4:
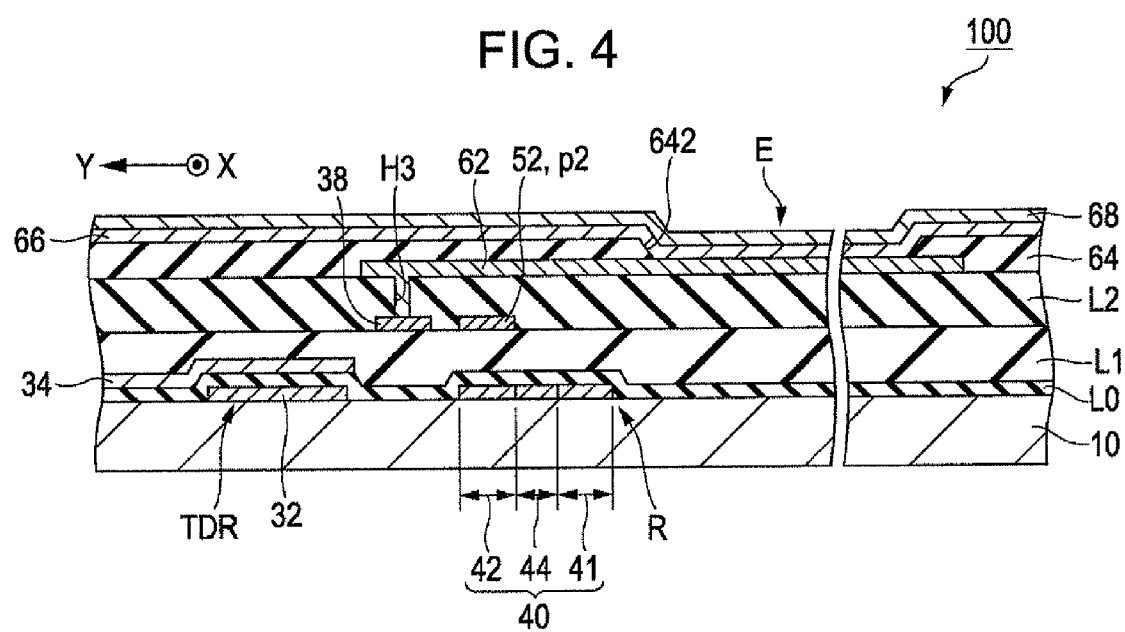
FIG. 4 is a cross-sectional view taken along the line IV-IV in FIG. 3.

FIG. 3 is a plan view of the unit circuit U, and FIG. 4 is a cross-sectional view taken along the line IV-IV of FIG. 3. As shown in FIGS. 3 and 4, when seen from a direction vertical to the substrate 10, the light emitting element E and the drive transistor TDR (pixel circuit G) are arranged in the Y direction, and the light receiving element R is arranged between the light emitting element E and the drive transistor TDR.

The drive transistor TDR is a P-channel type thin film transistor including a semiconductor layer 32 and a gate electrode 34. As shown in FIG. 4, the semiconductor layer 32 is covered by a light transmissive insulation layer L0. The gate electrode 34 is formed on the insulation layer L0, and faces a channel region of the semiconductor layer 32. The conductivity type of the drive transistor TDR is arbitrary.

The light receiving element R includes a light receiving layer 40. The semiconductor layer 32 and the light receiving layer 40 are collectively formed (hereinafter, simply described as "formed from the same layer") in a same manufacturing process by selectively removing a single film body. The semiconductor layer 32 and the light receiving layer 40 of this embodiment are a polysilicon film body obtained by crystallizing an amorphous silicon by laser radiation (laser annealing). Both the light receiving layer 40 and the semiconductor layer 32 are covered by the insulation layer L0.

The light receiving layer 40 is formed in a long shape continuously extending in the X direction crossing (orthogonally crossing) the Y direction going from the light emitting element E to the light receiving element R. As shown in FIGS. 3 and 4, the light receiving layer 40 includes a first region 41, a second region 42, and an intrinsic region 44 which are arranged on a surface parallel to the substrate 10. The first region 41, the second region 42, and the intrinsic region 44 extend in the x direction. As in FIG. 3, when seen from the direction vertical to the substrate 10, the second region 42 is located on the opposite side of the light emitting element E with the first region 41 therebetween.

The first region 41 and the second region 42 are regions formed by semiconductors having different conductivity types from each other. Specifically, the first region 41 is formed by one of a P type semiconductor and an N type semiconductor, and the second region 42 is formed by the other one of the P type semiconductor and the N type semiconductor. The first region 41 located on the light emitting element R side has a low sheet resistance (resistivity) compared with the second region 42. The intrinsic region 44 is an intrinsic semiconductor region located between the first region 41 and the second region 42. The light receiving layer 40 having the above configuration functions as a PIN (P-Intrinsic-N) type diode generating the detection signal SR of an electric current amount corresponding to a light amount emitted to the intrinsic region 44.

As shown in FIG. 4, a light transmissive insulation layer L1 is formed over an entire surface of the insulation layer L0 in which the gate electrode 34 is formed. As shown in FIG. 3, a source electrode 36 and a drain electrode 38 of the drive transistor TDR are formed on a surface of the insulation layer L1 by using a light reflective conductive material (for example, aluminum or silver). The source electrode 36 conducts electricity to a source region of the semiconductor layer 32 via a conductive hole H1a penetrating the insulation layer L1 and the insulation layer L0. In the same way, the drain electrode 38 conducts electricity to a drain region of the semiconductor layer 32 via a conductive hole H1b penetrating the insulation layer L1 and the insulation layer L0.

As shown in FIG. 3, the first detection electrode 51 and the second detection electrode 52 are formed from the same layer as the source electrode 36 and the drain electrode 38 of the drive transistor TDR on the surface of the insulation layer L1. The first detection electrode 51 and the second detection electrode 52 are light reflective electrodes (wirings) used to transmit the detection signal SR generated by the light receiving element R.

The first detection electrode 51 extends in the Y direction from a portion p1 overlapping an X direction end portion of the first region 41 of the light receiving layer 40. Therefore, a major portion of the first region 41 (a portion except for an end portion) does not overlap the first detection electrode 51. The portion p1 conducts electricity to the first region 41 of the light receiving layer 40 via a conductive hole H2a penetrating the insulation layer L1 and the insulation layer L0.

The second detection electrode 52 includes a portion p2. When seen from the direction vertical to the substrate 10, the portion p2 extends in the X direction to overlap an entire region of the second region 42 of the light receiving layer 40. The portion p2 conducts electricity to the second region 42 of the light receiving layer 40 via multiple conductive holes H2a penetrating the insulation layer L1 and the insulation layer L0. As understood from FIG. 3, an area overlapping the first detection electrode 51 (portion p1) in the first region 41 is smaller than an area overlapping the second detection electrode 52 (portion p2) in the second region 42. In the above configuration, an electric current flowing in the first detection electrode 51 and the second detection electrode 52 via the light receiving layer 40 is outputted to the outside (correction circuit 24) as the detection signal SR.

As shown in FIG. 4, a light transmissive insulation layer L2 is formed over an entire surface of the insulation layer L1. The insulation layer L2 is constituted by, for example, a laminate (not shown in the figures) of an inorganic layer such as a silicon oxide and a silicon nitride, and a planarizing layer which reduces unevenness of the surface of the insulation layer L2 caused by reflecting the drive transistor TDR and the light receiving element R.

A first electrode 62 (outline is shown by a dashed line for convenience in FIG. 3) which functions as an anode of the light emitting element E is formed on the surface of the insulation layer L2. The first electrode 62 is formed by using a light transmissive conductive material such as ITO (Indium Tin Oxide). As in FIG. 31 when seen from the direction vertical to the substrate 10, the first electrode 62 is continuously formed from a gap between the light receiving element R and the drive transistor TDR to an area on the opposite side of the drive transistor TDR as seen from the light receiving element R. Therefore, the light receiving element R and the first electrode 62 overlap each other. As shown in FIGS. 3 and 4, the first electrode 62 conducts electricity to the drain electrode 38 of the drive transistor TDR via a conductive hole H3 penetrating the insulation layer L2. When seen from the direction vertical to the substrate 10, the conductive hole H3 is located in a gap between the drive transistor TDR (semiconductor layer 32) and the light receiving element R (light receiving layer 40).

As shown in FIG. 4, an element definition layer (bank layer) 64 is formed on the surface of the insulation layer L2 on which the first electrode 62 is formed. As shown in FIGS. 3 and 4, the element definition layer 64 is an insulative film body in which an opening 642 is formed to a shape corresponding to an outer shape of the light emitting element E. The first electrode 62 includes a portion located inside the opening 642 (in other words, a portion exposing from the element definition layer 64 via the opening 642). As in FIG. 3, when seen from the direction vertical to the substrate 10, the opening 642 is formed to a position and shape which do not overlap the light receiving layer 40 of the light receiving element R.

As shown in FIG. 4, a light emitting layer 66 is formed to cover the element definition layer 64 and the first electrode 62. The light emitting layer 66 is formed over the entire region of the substrate 10 to continuously extend over the multiple unit circuits U (light emitting elements E). A film formation technique such as a spin coat method is preferably used to form the light emitting layer 66. As shown in FIG. 4, a second electrode 68 is formed on a surface of the light emitting layer 66. The second electrode 68 is continuously formed over the multiple unit circuits U (light emitting elements E) to function as a cathode of each light emitting element E. A light reflective conductive material (for example, aluminum or silver) is used to form the second electrode 68.

As shown in FIGS. 3 and 4, in the laminate of the first electrode 62, the light emitting layer 66, and the second electrode 69, a portion inside the opening 642 of the element definition layer 64 functions as the light emitting element E. Since the opening 642 is formed in an area which does not overlap the light receiving layer 40 in the element definition layer 64, when seen from the direction vertical to the substrate 10 as in FIG. 3, the light receiving layer 40 of the light receiving element R and the light emitting element E do not overlap each other. In other words, the light receiving element R is formed in an area other than an area which overlaps the light emitting element E on the surface of the substrate 10.

A part of light emitted from the light emitting element E (light emitting layer 66) reaches the first electrode 62 after reflecting on the second electrode 68 or directly from the light emitting layer 66, transmits the first electrode 62, the insulation layers (L2, L1, L0), and the substrate 10, and exits to the outside (photosensitive drum 70). In other words, the light emitting apparatus 100 of this embodiment is a bottom emission type. On the other hand, another part of the light emitted from the light emitting element E proceeds to the light receiving element R after reflecting on the second electrode 68 or directly from the light emitting layer 66 as shown by arrows in FIG. 3, and reaches and enters the light receiving layer 40 to be used to generate the detection signal SR.

In the above configuration, since the light receiving element R is formed not to overlap the light emitting element E, the light which is emitted from the light emitting element E and emitted to the outside (to the photosensitive drum 70) does not go through the light receiving element R. Therefore, it is possible to increase the use efficiency of the light emitted from the light emitting element E, compared with a configuration of Patent Document 1 (a configuration in which the light emitted from the light emitting element E exits to the outside after transmitting the light receiving element R) where the light emitting element E and the light receiving element R overlap each other. And, by increasing the use efficiency of the emitted light, a necessary electric current amount of the drive current IDR for driving the light emitting element E to emit an expected light amount (to emit light with an expected brightness) is reduced. Therefore, there is an advantage that a deterioration of the light emitting element E over time is suppressed and a long element life is realized.

In the light receiving layer 40 of the light receiving element B, an area where the first region 41 on the light emitting element E side of the second area 42 is covered by the first detection electrode 51 (portion p1) is smaller than an area where the second region 42 is covered by the second detection electrode 52 (portion p2). In other words, although the entire region of the second region 42 is covered by the second detection electrode 52, the area covered by the first detection electrode 51 (portion p1) in the first region 41 is only a part of the first region 41. Therefore, there is an advantage that a large amount of light entering the light receiving layer 40 can be secured from the light which is emitted from the light emitting element E and goes to the light receiving element R, compared with the configuration in which the first detection electrode 51 covers the entire region of the first region 41 (in other words, a configuration in which the first detection electrode 51 is formed to the same shape as the second detection electrode 52).

Furthermore, since the second detection electrode 52 is formed to cover the entire region of the second region 42, there is an advantage that a resistance of a path from the second region 42 to the outside (correction circuit 24) via the second detection electrode 52 can be reduced compared with a configuration in which the second detection electrode 52 covers only an end potion of the second region 42 (in other words, a configuration in which the second detection electrode 52 is formed to the same shape as the first detection electrode 51). On the other hand, since a sheet resistance of the first region 41 is lower than that of the second region 42, a resistance of a path from the first region 41 to the outside via the first detection electrode 51 is reduced compared with a configuration in which the first region 41 has a higher resistance than the second region 42, although only a part of the first region 41 conducts electricity to the first detection electrode 51. Since the light reflective second detection electrode 52 is formed to cover the entire region of the second region 42, there is also an advantage that a possibility in which light which is emitted from the light emitting element E and does not enter the light receiving element R is reflected on the second detection electrode 52 and enters the light receiving element R increases. As described above, according to this embodiment, it is both possible to lower the resistance of a path in which the detection signal SR is transferred and to secure the amount of the light entering the light receiving layer 40.

B: Second Embodiment

Next, a second embodiment of the invention will be described. In each embodiment below, the elements common to the first embodiment will be represented by the same reference characters as the above description, and detailed description thereof will be properly omitted.

Figure 5:
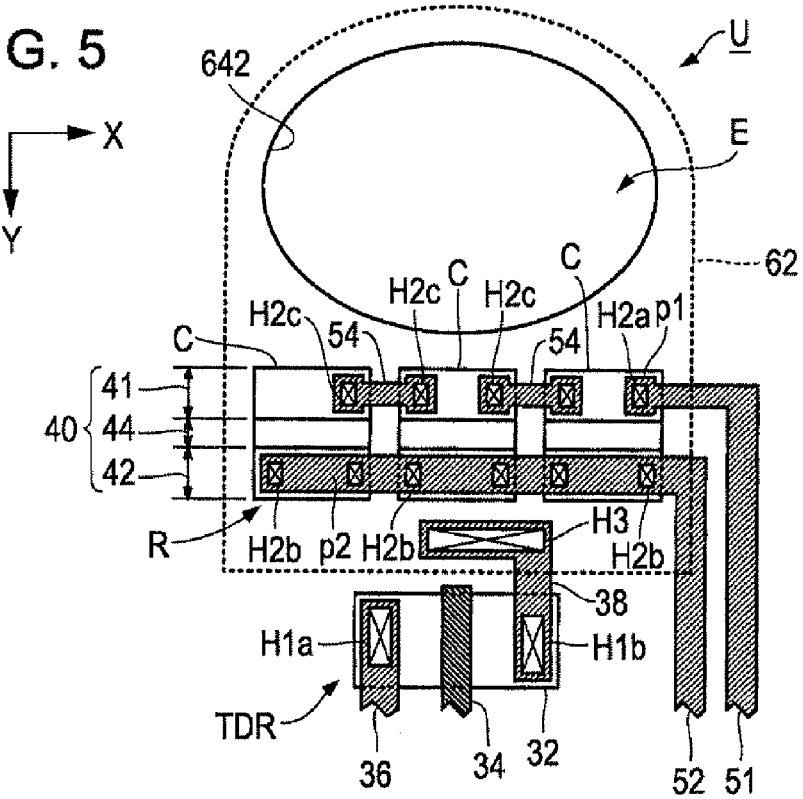
FIG. 5 is a plan view of the unit circuit in the light emitting apparatus of the second embodiment of the invention.

FIG. 5 is a plan view of the unit circuit U in the light emitting apparatus 100 of the second embodiment (light emitting element E, drive transistor TDR, light receiving element R) As shown in FIG. 5, the light receiving layer 40 is constituted by multiple unit sections C (three unit sections in FIG. 5) arranged in the X direction with a gap therebetween. Each unit section C is a film body having an approximately rectangular shape formed from the same layer as the semiconductor layer 32 of the drive transistor TDR. Each unit section C is constituted by the first region 41 and the second region 42 which have a different conductivity type from each other, and the intrinsic region 44 therebetween. Each unit section C functions as a PIN type diode. Like the first embodiment, the first region 41 is located on the light emitting element E side when seen from the second region 42, and the sheet resistance (resistivity) of the first region 41 is lower than the sheet resistance of the second region 42.

The first detection electrode 51 has the same shape as that of the first embodiment, and includes a portion p1 conducting electricity to an end portion of the first region 41 in a unit section C. A conducting electrode 54 is formed at every gap between each unit section C next to each other. Each conducting electrode 54 is formed separately from each other to bridge the gap between the unit sections C next to each other. Both end portions of the conducting electrode 54 conduct electricity to each first region 41 via a conductive hole H2c overlapping the first region 41 of the unit sections C. Therefore, the first regions 41 of the multiple unit sections C conduct electricity to each other.

On the other hand, the second detection electrode 52 has the same shape as that of the first embodiment, continuously extends over each second region 42 of the multiple unit sections C in the X direction, and includes a portion p2 covering the entire region of the second regions 42 of the unit sections C. The second detection electrode 52 conducts electricity to the second region 42 of each unit section C via multiple conductive holes H2b penetrating the insulation layer L1 and the insulation layer L0. Therefore, the second regions 42 of the multiple unit sections C conduct electricity to each other.

An electric current flowing in the first detection electrode 51 and the second detection electrode 52 via each of the multiple unit sections C in parallel is outputted as the detection signal SR. Like the first embodiment, a total area of areas where the first detection electrode 51 or the conducting electrode 54 overlaps the first regions 41 in the multiple unit sections C is smaller than a total area of areas where the second detection electrode 52 overlaps the second regions 42 in the multiple unit sections C.

In the above embodiment, the same effect as the first embodiment is realized. When the light receiving layer 40 is integrally formed like the first embodiment, the light receiving layer 40 may be electrically destroyed due to static electricity generated in processes (for example, processes for forming the first detection electrode 51 and the second detection electrode 52) after forming the light receiving layer 40. In this embodiment, since the light receiving layer 40 is divided into multiple unit sections C, a possibility that the entire light receiving layer 40 is destroyed due to static electricity is reduced. Therefore, there is an advantage that a yield of the light emitting apparatus 100 is improved compared with the first embodiment.

C: Third Embodiment

Figure 6:
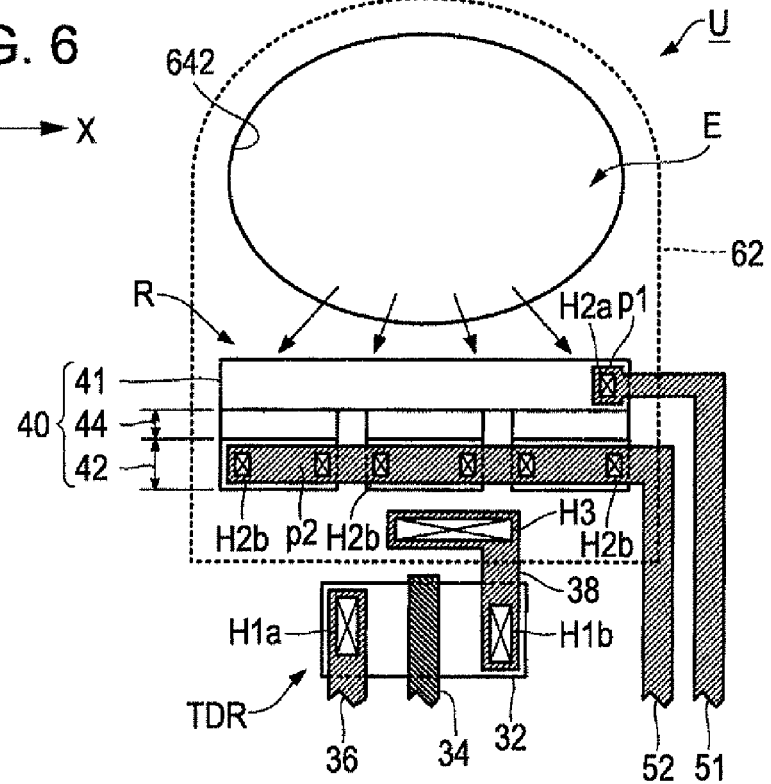
FIG. 6 is a plan view of the unit circuit in the light emitting apparatus of the third embodiment of the invention.

FIG. 6 is a plan view of the unit circuit U in the light emitting apparatus 100 of the third embodiment of the invention. As shown in FIG. 6, the light receiving layer 40 is constituted by a single first region 41 continuously extending in the X direction, multiple second regions 42 arranged in the X direction with a gap therebetween, and multiple intrinsic regions 44 arranged in the X direction with a gap therebetween.

The first region 41 and the second region 42 have a different conductivity type from each other. Each of the second regions 42 is located on the opposite side of the light emitting element E with the first region 41 therebetween, and each intrinsic region 44 is located between the first region 41 and the second regions 42. In other words, the light receiving element R of this embodiment has a structure in which the first regions 41 of each of multiple PIN diodes constituted by the first region 41, the intrinsic region 44, and the second region 42 are connected. Like the first embodiment, the sheet resistance (resistivity) of the first region 41 is lower than the sheet resistance of the second region 42.

The first detection electrode 51 has the same shape as that of the first embodiment, and includes a portion p1 conducting electricity to an end portion of the first region 41. Therefore, a most portion of the first region 41 (a portion except for an end portion) does not overlap the first detection electrode 51. On the other hand, the second detection electrode 52 has the same shape as that of the second embodiment, continuously extends over multiple second regions 42 in the X direction, and includes a portion p2 conducting electricity to each of the second regions 42 via multiple conductive holes H2b. Like the first embodiment, an area where the first detection electrode 51 overlaps the first regions 41 is smaller than a total area of areas in the multiple second regions 42 where the second detection electrode 52 overlaps the second region 42.

In the above embodiment, the same effect as the first embodiment is realized. In this embodiment, since a portion where the light receiving layer 40 is covered by the first detection electrode 51 (portion p1) is only a part of the first region 41, there is an advantage that a large amount of light entering the light receiving layer 40 can be secured, compared with the second embodiment in which each first region 41 is covered by the conducting electrodes 54. Since the second region 42 is divided into multiple sections, there is an advantage that a possibility of the light receiving layer 40 being destroyed due to static electricity is reduced, compared with the first embodiment in which the second region 42 is integrally formed. As a result, according to this embodiment, it is possible both to secure the amount of light entering the light receiving layer 40 and to reduce the possibility of the light receiving layer 40 being destroyed.

D: Fourth Embodiment

Figure 7:
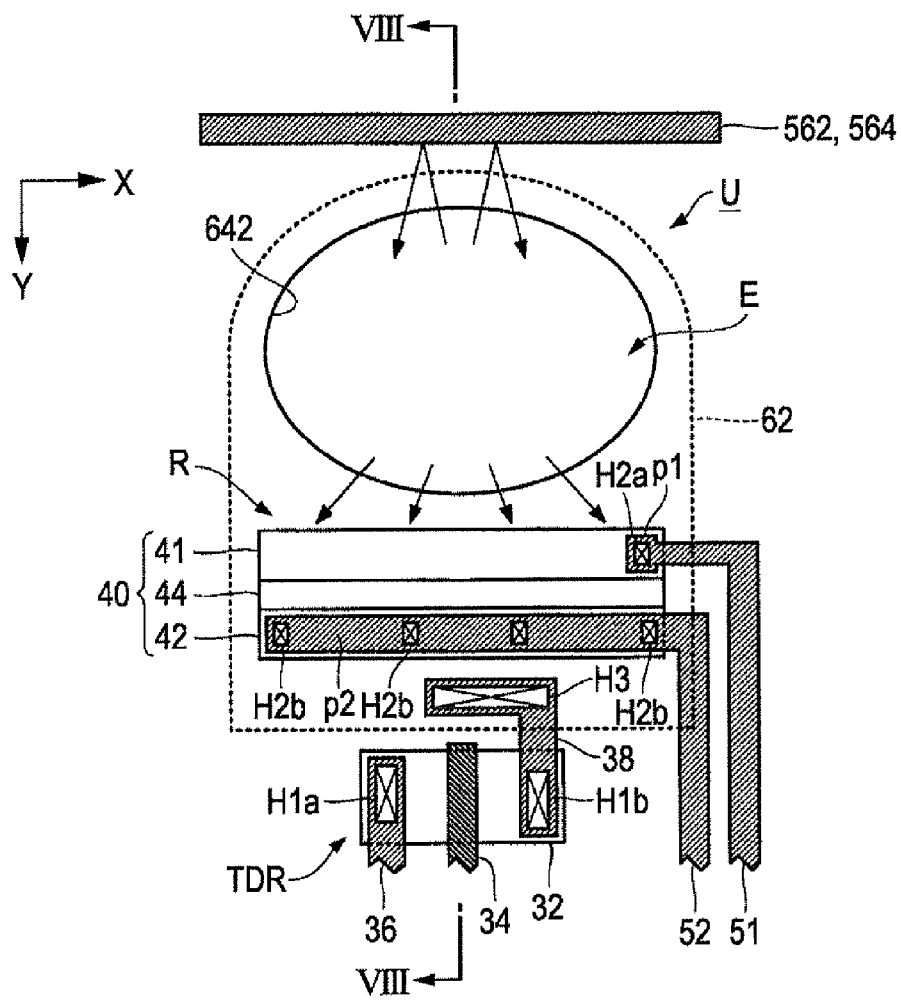
FIG. 7 is a plan view of the unit circuit in the light emitting apparatus of the fourth embodiment of the invention.
Figure 8:
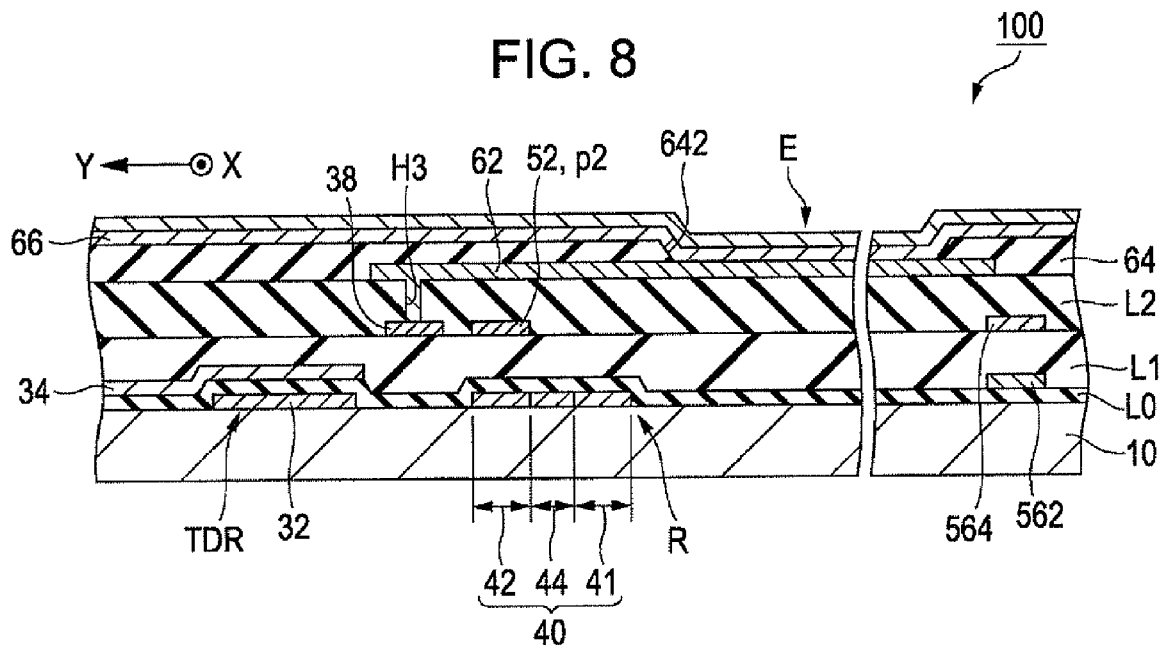
FIG. 8 is a cross-sectional view taken along the line VIII-VIII in FIG. 7.

FIG. 7 is a plan view of the unit circuit U in the light emitting apparatus 100 of the fourth embodiment of the invention, and FIG. 8 is a cross-sectional view taken along the line VIII-VIII in FIG. 7. As shown in FIGS. 7 and 8, when seen from the direction vertical to the substrate 10, the reflective layer 562 and the reflective layer 564 are formed on the opposite side of the light receiving element R with the light emitting element E therebetween. The reflective layer 562 is a light reflective film body formed from the same layer as the gate electrode 34 of the drive transistor TDR, and the reflective layer 564 is a light reflective film body formed from the same layer as the source electrode 36 and the drain electrode 38 of the drive transistor TDR. As shown in FIG. 7, the reflective layer 562 and the reflective layer 564 extend in the X direction.

In the above embodiment, the light that is emitted from the light emitting element E and goes to the opposite side of the light receiving element R is reflected by a surface and edge surfaces of the reflective layer 562 and the reflective layer 564 to the light receiving element R side. Therefore, there is an advantage that a large amount of light entering the light receiving element R can be secured, compared with a configuration in which the reflective layer 562 and the reflective layer 564 are not formed (in other words, a configuration in which the light emitted to the opposite side of the light receiving element R does not reach the light receiving element R). FIGS. 7 and 8 illustrate a configuration in which the reflective layer 562 and the reflective layer 564 are added to the light emitting apparatus 100 of the first embodiment. Also, in the second embodiment and the third embodiment, the reflective layer 562 and the reflective layer 564 are added in the same way.

E: Modified Example

Various modifications illustrated below are added to each embodiment described above. Two or more aspects may be arbitrary selected and combined from the examples illustrated below.

(1) Modified Example 1

Although a PIN type photodiode is used as the light receiving element R in the above embodiments, a configuration (type) of the light receiving element R is arbitrary changed. For example, an embodiment which uses a PN type diode (a configuration where the intrinsic region 44 is omitted in each of the above embodiments) or a phototransistor as the light receiving element R is also preferable.

(2) Modified Example 2

Figure 9:
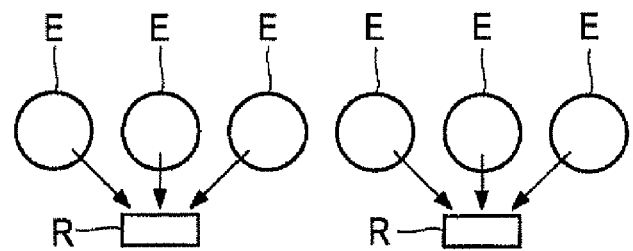
FIG. 9 is a schematic view of the light emitting apparatus of a modified example.

In the above embodiments, although one light receiving element R is arranged for every one light emitting element E, the number of the light receiving elements R (for a certain number of light emitting elements E) is arbitrary changed. For example, as shown in FIG. 9, a configuration in which one light receiving elements R is arranged for a unit of multiple light emitting elements E (three light emitting elements E in FIG. 9) is also employed. The light receiving element R may receive light emitted from multiple light emitting elements E as shown in FIG. 9, and also may receive light emitted from only one light emitting element E.

(3) Modified Example 3

Figure 10:
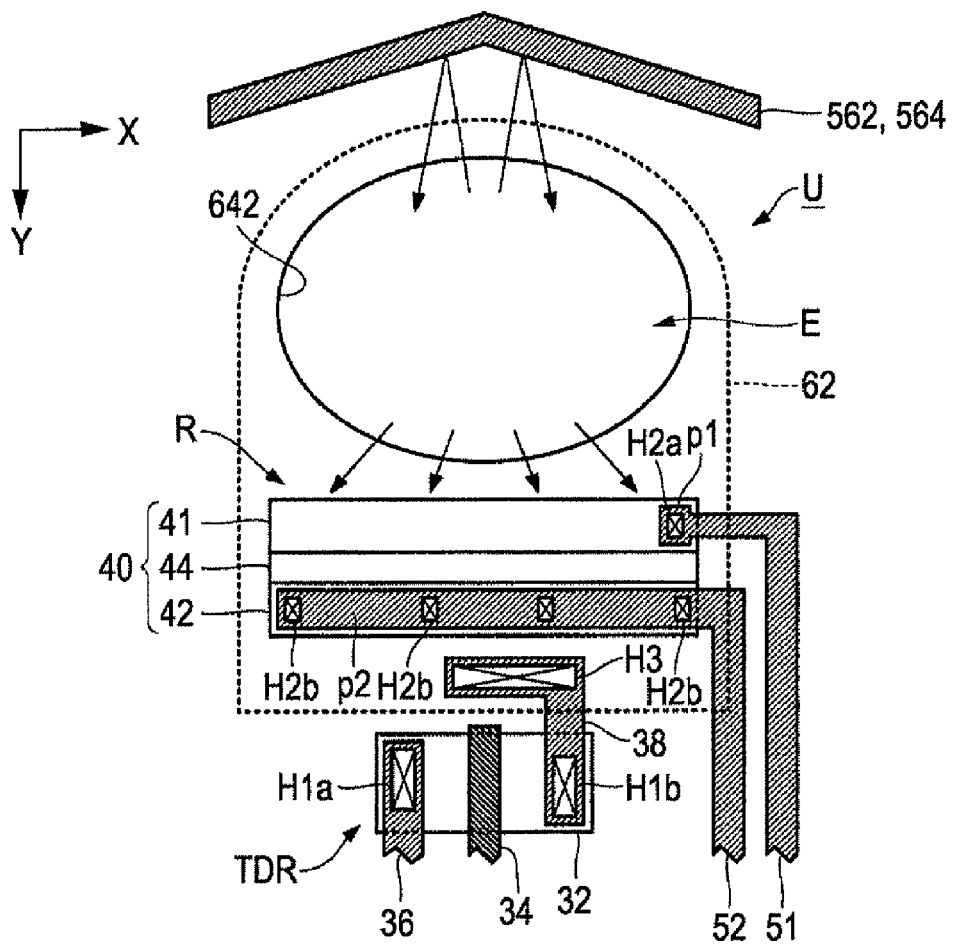
FIG. 10 is a plan view of the unit circuit of another modified example.
Figure 11:
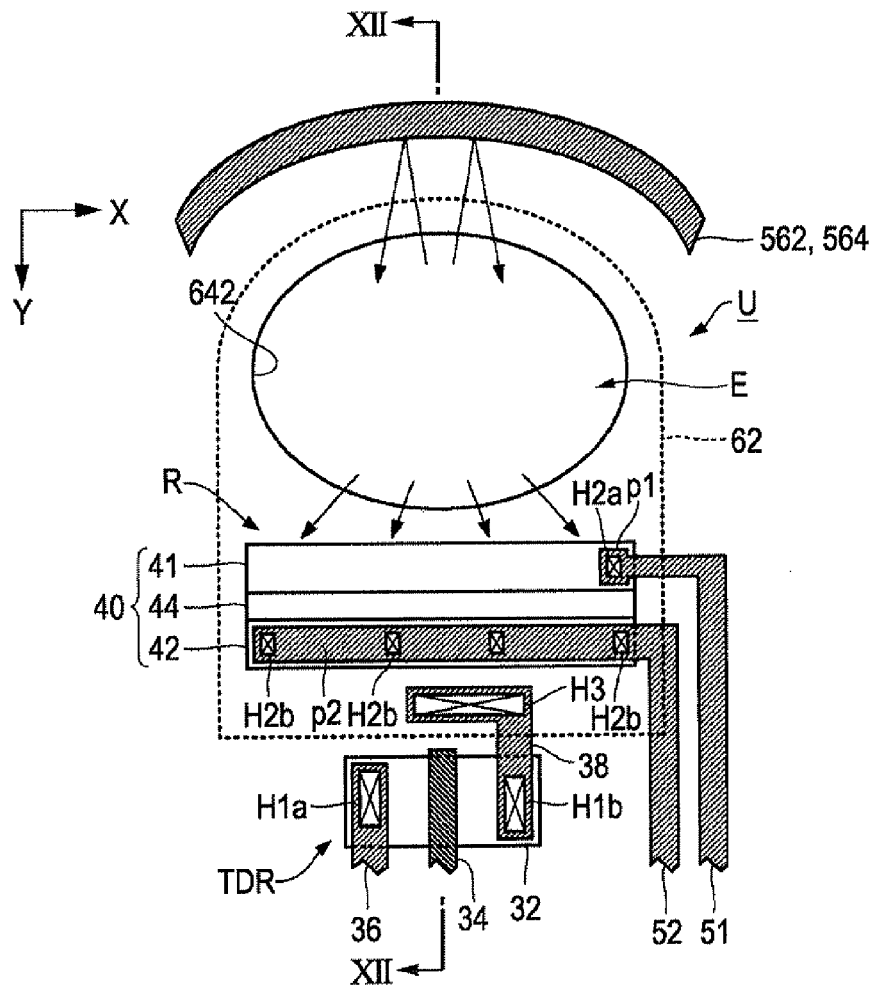
FIG. 11 is a plan view of the unit circuit of another modified example.

A shape of the reflective layers (562, 564) in the fourth embodiment is properly changed. For example, as shown in FIGS. 10 and 11, a configuration in which the reflective layer 562 and the reflective layer 564 are formed to be a broken line shape (FIG. 10) or a curved line shape (FIG. 11) both of which have a concave surface facing the light emitting element E when seen from the direction vertical to the substrate 10 is also preferable. According to the configuration of FIGS. 10 and 11, there is an advantage that the light emitted from the light emitting element E is effectively collected to the light receiving element R.

Figure 12:
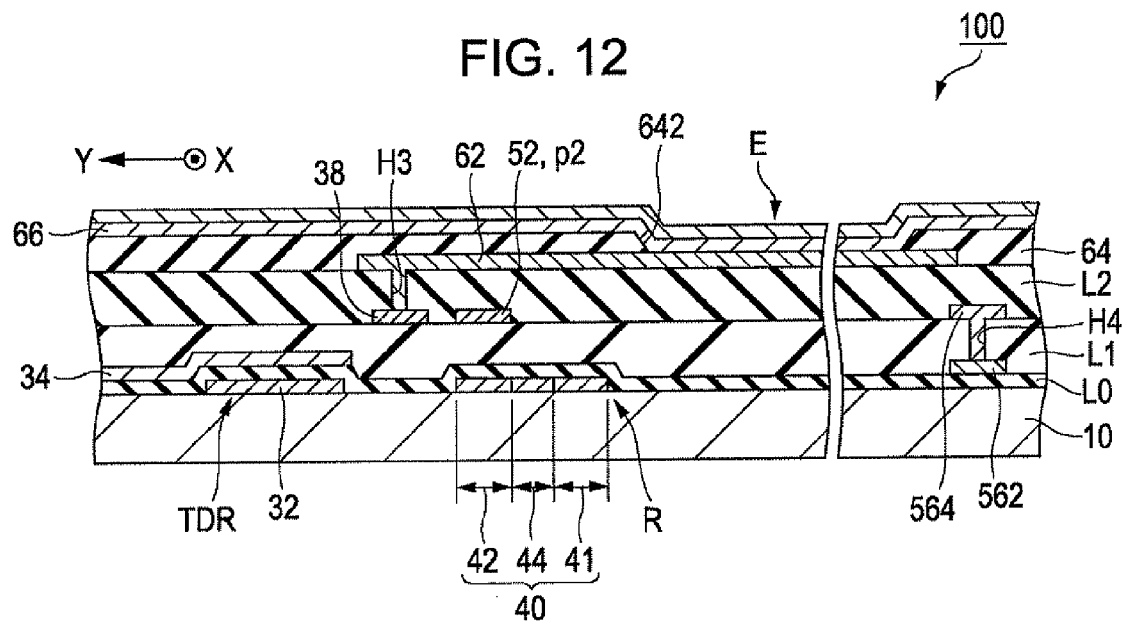
FIG. 12 is a cross-sectional view of the light emitting apparatus of another modified example.

As shown in FIG. 12, a configuration in which the reflective layer 564 is formed to enter inside of one or multiple holes H4 formed in the insulation layer L0 is also preferable. According to the above configuration, since the light emitted from the light emitting element E is reflected even on a portion where the reflective layer 564 covers an inner surface of the hole H4, an amount of the light entering the light receiving element R can be increased. The configuration of FIG. 12 is applied also to the reflective layer 562 in the same way.

(4) Modified Example 4

A configuration of the pixel circuit G is arbitrary. More specifically, a location of the drive transistor TDR is properly changed. For example, a configuration in which the drive transistor TDR is arranged in parallel with the light emitting element E is also preferable. The transistor including the semiconductor layer formed by the same process as the light receiving layer 40 of the light receiving element R is not limited to the drive transistor TDR. For example, in a configuration in which the pixel circuit G includes a selection transistor for controlling conduction of the gate of the drive transistor TDR and the output end (data line) of the drive circuit 22, the light receiving layer 40 of the light receiving element R is formed from the same layer as the semiconductor layer of the selection transistor. In other words, a configuration in which the light receiving element R (light receiving layer 40) is formed from the same layer as the semiconductor layer of the transistor (for example, drive transistor TDR and selection transistor) formed on the substrate 10 and used for driving the light emitting element E is preferred in the embodiment of the invention.

(5) Modified Example 5

In the above embodiments, each element formed from the same layer can be formed separately. For example, the light receiving layer 40 of the light receiving element R is formed by a different process from the semiconductor layer 32 of the drive transistor TDR, and the first detection electrode 51 or the second detection electrode 52, and the conducting electrode 54 of the second embodiment are formed by a different process from the source electrode 36 and the drain electrode 38 of the drive transistor TDR. The reflective layer 562 and the reflective layer 564 of the fourth embodiment are formed by a different process from the gate electrode 34 and the source electrode 36 of the drive transistor TDR. In a configuration in which each element of the light emitting apparatus 100 is formed from the same layer, there is an advantage that a manufacturing process of the light emitting apparatus 100 is simplified compared with a case in which each element is formed individually.

(6) Modified Example 6

A configuration of the light emitting element E is properly changed. For example, although the light emitting layer 66 illustrated in FIG. 4 continues over the multiple unit circuits U, a configuration in which the light emitting layer 66 of each unit circuit U is arranged separately from each other is also preferred. The organic EL element is an example of the light emitting element, and the embodiment of the invention is also applied to a light emitting apparatus including a light emitting element such as an inorganic EL element and an LED (Light Emitting Diode) element, in the same way as the above embodiments. The light emitting element of the embodiment of the invention is an electro-optic element which emits light by supplying electric energy (applying an electric field or supplying an electric current).

F. Application Example

Next, a specific configuration of an electronic device (image forming apparatus) using the light emitting apparatus 100 of the above embodiments will be described.

Figure 13:
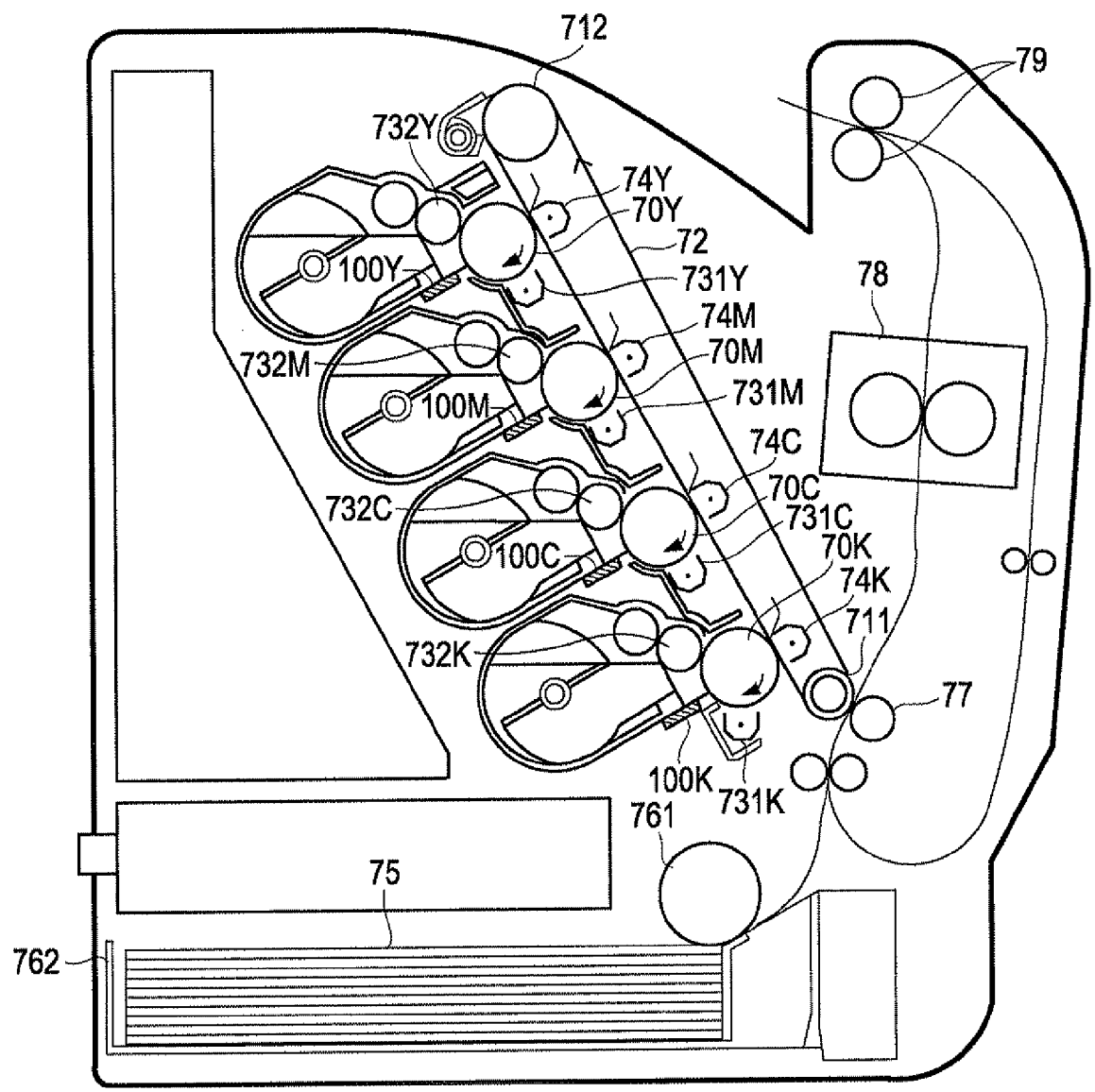
FIG. 13 is a conceptual diagram showing a specific example of an electronic device (image forming apparatus).

FIG. 13 is a cross-sectional view showing a configuration of the image forming apparatus. The image forming apparatus is a tandem type full color image forming apparatus, which includes four light emitting apparatuses 100 (100K, 100C, 100M, 100Y) according to any one of the above illustrated embodiments and four photosensitive drums 70 (70K, 70C, 70M, 70Y) corresponding to each light emitting apparatus 100. As shown in FIG. 1, one light emitting apparatus 100 is arranged to face an exposed surface 70A (outer surface) of the photosensitive drum 70 corresponding to the light emitting apparatus 100. Each additional letter "K", "C", "M", "Y" of the reference characters indicate that they are used for forming actual images of black (K), cyan (C), magenta (M), and yellow (Y) respectively.

As shown in FIG. 13, an endless intermediate transfer belt 72 is wound around a drive roller 711 and a driven roller 712. The four photosensitive drums 70 are arranged around the intermediate transfer belt 72 with a predetermined gap between the drums. Each of the photosensitive drums rotates in synchronization with a drive of the endless intermediate transfer belt 72.

Around the photosensitive drums 70, in addition to the light emitting apparatus 100, a corona charging unit 731 (731K, 731C, 731N, 731Y) and a developing unit 732 (732K, 732C, 732M, 732Y) are arranged. The corona charging unit 731 uniformly electrically charges the exposed surface 70A of the photosensitive drum 70 corresponding the corona charging unit 731. Each of the light emitting apparatuses 100 exposes the charged exposed surface 70A, so that an electrostatic latent image is formed. Each of the developing units 732 adheres a developing material (toner) to the electrostatic latent image, so that an actual image (visible image) is formed on the photosensitive drum 70.

As described above, each color actual image (black, cyan, magenta, yellow) formed on the photosensitive drum 70 is transferred (first transferred) sequentially to the surface of the intermediate transfer belt 72, so that a full color actual image is formed. Four first transfer corotrons (transfer units) 74 (74K, 74C, 74M, 74Y) are arranged inside the intermediate transfer belt 72. Each first transfer corotron 74 electrostatically absorbs the actual image from the photosensitive drum 70 corresponding to the transfer corotron 74 to transfer the actual image to the intermediate transfer belt 72 passing through a gap between the photosensitive drum 70 and the first transfer corotron 74.

A sheet (recording material) 75 is fed one by one from a sheet feeding cassette 762 by a pickup roller 761, and transported to a nip between the intermediate transfer belt 72 and a second transfer roller 77. The full color actual image formed on the intermediate transfer belt 72 is transferred (second transferred) to one side of the sheet 75 by a second transfer roller 77, and is passed through a pair of fuser rollers 78 to be fixed on the sheet 75. A pair of sheet ejection rollers 79 eject the sheet 75 on which the actual image is fixed after the above processes.

Since the image forming apparatus illustrated above uses an organic EL element as a light source (exposure unit), the apparatus can be downsized compared with a configuration which uses a laser scanning optical system. The light emitting apparatus 100 can be applied to an image forming apparatus other than the image forming apparatus having a configuration illustrated above. For example, the light emitting apparatus 100 can also be used for a rotary developing type image forming apparatus, an image forming apparatus which directly transfers an actual image from the photosensitive drum 70 to the sheet without using the intermediate transfer belt, or an image forming apparatus which forms a monochromatic image.

The usage of the light emitting apparatus 100 is not limited to exposing the image carrier (photosensitive drum 70). For example, the light emitting apparatus 100 is employed in an image reading apparatus as an illumination apparatus for emitting light to a reading object such as an original document. As this kind of image reading apparatus, there are a scanner, a reading section of a copy machine and a facsimile, a barcode reader, and a two-dimensional image code reader for reading a two-dimensional image code such as a QR code (registered trademark).

In addition, a light emitting apparatus in which light emitting elements E are arranged in matrix form is also used as a display apparatus of various electronic devices. As an electronic device to which the embodiment of the invention is applied, for example, there are a mobile type personal computer, a mobile phone, a mobile information terminal (PDA: Personal Digital Assistants), a digital still camera, a television, a video camera, a car navigation apparatus, a pager, an electronic notebook, an electronic paper, an electronic calculator, a word processor, a work station, a television-phone, a POS terminal, a printer, a scanner, a copy machine, a video player, a device equipped with a touch panel, and so on.

The entire disclosure of Japanese Patent Application No. 2008-165525, filed Jun. 25, 2008 is expressly incorporated by reference herein.

What is claimed is:

1. A light emitting apparatus comprising:
a light emitting element formed on a surface of a substrate;
a light receiving element formed on an area other than an area overlapping the light emitting element on the surface of the substrate, the light receiving element detecting light emitted from the light emitting element, the light receiving element including a light receiving layer having a first single layer and a second single layer;
a first detection electrode conducting electricity to the first single layer is formed above the first single layer; and
a second detection electrode conducting electricity to the second single layer is formed above the second single layer, wherein
the light receiving element is capable of generating a current corresponding to an amount of light emitted by the light emitting element,
the first single layer of the light receiving layer is formed of one of a p-type semiconductor material or an n-type semiconductor material,
the second single layer of the light receiving layer is formed of an other one of the p-type semiconductor material or the n-type semiconductor material, and
an area of the first single layer overlapped by the first detection electrode is smaller than an area of the second single layer overlapped by the second detection electrode.

2. The light emitting apparatus according to claim 1, wherein the light emitting element is formed on a surface of an insulating layer covering the light receiving element, and a part of the light emitted from the light emitting element is emitted so as to be transmitted through the insulating layer and the substrate.

3. The light emitting apparatus according to claim 2, wherein the first single layer and the second single layer have different conductivity types from each other, and the first single layer is located between the second single layer and the light emitting element.

4. The light emitting apparatus according to claim 3, wherein,
the first detection electrode overlaps the first single layer and the second detection electrode overlaps the second single layer in plan view.

5. The light emitting apparatus according to claim 4, wherein a sheet resistance of the first single layer is lower than a sheet resistance of the second single layer.

6. The light emitting apparatus according to claim 3, wherein the light receiving layer is a single film body in which the first single layer and the second single layer extend in a second direction crossing a first direction going from the light emitting element to the light receiving element.

7. The light emitting apparatus according to claim 6, wherein,
the first detection electrode having a portion overlapping a part of the first single layer conducts electricity to the first single layer, and
the second detection electrode having a portion overlapping the second single layer and extending in the second direction conducts electricity to the second single layer.

8. The light emitting apparatus according to claim 3, wherein the light receiving layer includes a plurality of unit sections arranged with gaps therebetween in a second direction crossing a first direction going from the light emitting element to the light receiving element, each of the plurality of unit sections having the first single layer and the second single layer, the first single layers of the unit sections conduct electricity to each other, and the second single layers of the unit sections conduct electricity to each other.

9. The light emitting apparatus according to claim 8, wherein
the first detection electrode includes a plurality of conducting electrodes formed separately from each other at every gap to bridge the gaps between the unit sections next to one another, a part of each of the plurality of conducting electrodes overlapping a part of the first single layer conducting electricity to the first single layer; and
the second detection electrode, a part of which extends in the second direction to penetrate through each of the second regions of the plurality of unit sections, the part conducting electricity to each of the second single layers.

10. The light emitting apparatus according to claim 3, wherein the light receiving layer includes the first single layer continuously extending along a second direction crossing a first direction going from the light emitting element to the light receiving element, and the second single layer includes a plurality of unit sections arranged with gaps therebetween in the second direction, wherein the plurality of the unit sections conduct electricity to each other.

11. The light emitting apparatus according to claim 10, wherein
the first detection electrode having a portion thereof overlapping a part of the first single layer conducts electricity to the first single layer, and
the second detection electrode, a part of the second detection electrode extending in the second direction to penetrate through each of the unit sections conducting electricity to each of the unit sections.

12. The light emitting apparatus according to claim 1, further comprising:

a transistor formed on the surface of the substrate and used to drive the light emitting element, wherein the light emitting element is formed by the same layer as a semiconductor layer of the transistor.

13. The light emitting apparatus according to claim 1, further comprising:

a reflective layer formed on an opposite side of the light receiving element with the light emitting element therebetween on the surface of the substrate.

14. An electronic device comprising the light emitting apparatus according to claim 1.

* * * * *